(12) United States Patent
Ikeda

(10) Patent No.: US 10,483,839 B2
(45) Date of Patent: Nov. 19, 2019

(54) SEMICONDUCTOR DEVICE, POWER CONVERSION DEVICE, DRIVING DEVICE, VEHICLE, AND ELEVATOR

(71) Applicant: Kabushiki Kaisha Toshiba, Minato-ku (JP)

(72) Inventor: Kentaro Ikeda, Kawasaki (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 15/896,563

(22) Filed: Feb. 14, 2018

(65) Prior Publication Data

US 2019/0140536 A1    May 9, 2019

(30) Foreign Application Priority Data

Nov. 7, 2017   (JP) .................................. 2017-214525

(51) Int. Cl.
| | |
|---|---|
| *H02M 1/32* | (2007.01) |
| *H02M 7/537* | (2006.01) |
| *G01R 19/00* | (2006.01) |
| *H02M 1/34* | (2007.01) |

(52) U.S. Cl.
CPC .............. *H02M 1/32* (2013.01); *G01R 19/00* (2013.01); *H02M 1/34* (2013.01); *H02M 7/537* (2013.01); *H02M 2001/322* (2013.01); *H02M 2001/346* (2013.01)

(58) Field of Classification Search
CPC ..................................................... H02M 1/32
See application file for complete search history.

(56) References Cited

U.S. PATENT DOCUMENTS 4,412,337 A * 10/1983 Bickley ................. H03F 1/3247
                                                    330/149
5,381,115 A *  1/1995 Timmons ................. H03G 1/04
                                                    330/129

(Continued)

FOREIGN PATENT DOCUMENTS

| JP | 63-171371 | 7/1988 |
|---|---|---|
| JP | 5-344369 | 12/1993 |

(Continued)

*Primary Examiner* — Jue Zhang
*Assistant Examiner* — Trinh Q Dang
(74) *Attorney, Agent, or Firm* — Oblon, McClelland, Maier & Neustadt, L.L.P.

(57) ABSTRACT

A semiconductor device according to an embodiment includes: a first capacitor having a first end and a first the other end, the first end for electrically connecting to at least one of a first electrode and a second electrode of a transistor having the first electrode, the second electrode, and a gate electrode; a first diode having a first anode and a first cathode, the first anode electrically connected to the first the other end; a second capacitor having a second end and a second the other end, the second end electrically connected to the first cathode; a sample and hold circuit electrically connected to the first cathode and the second end; a switch electrically connected in parallel with the second capacitor between the second end and the second the other end; and a second diode having a second anode and a second cathode, the second cathode electrically connected to the first the other end and the first anode.

34 Claims, 12 Drawing Sheets

(56) References Cited

U.S. PATENT DOCUMENTS

| | | | | |
|---|---|---|---|---|
| 2001/0035721 A1* | 11/2001 | Halberstadt | ........ | H05B 41/2828 |
| | | | | 315/219 |
| 2010/0097122 A1* | 4/2010 | Flaherty | ............. | H05B 37/0218 |
| | | | | 327/514 |
| 2014/0238782 A1* | 8/2014 | Ishiguro | .................. | B66B 1/302 |
| | | | | 187/290 |
| 2014/0266104 A1* | 9/2014 | El-Nozahi | ............... | G05F 1/575 |
| | | | | 323/280 |
| 2015/0331984 A1* | 11/2015 | Mellteg | ............... | G06F 17/5063 |
| | | | | 716/132 |
| 2017/0353128 A1 | 12/2017 | Ikeda et al. | | |
| 2018/0099658 A1* | 4/2018 | Ossareh | ................ | F02D 41/062 |
| 2018/0375423 A1 | 12/2018 | Ikeda | | |

FOREIGN PATENT DOCUMENTS

| | | |
|---|---|---|
| JP | 2017-221004 | 12/2017 |
| JP | 2019-9914 A | 1/2019 |

* cited by examiner

SEMICONDUCTOR DEVICE, POWER CONVERSION DEVICE, DRIVING DEVICE, VEHICLE, AND ELEVATOR

CROSS-REFERENCE TO RELATED APPLICATION

This application is based upon and claims the benefit of priority from Japanese Patent Application No. 2017-214525, filed on Nov. 7, 2017, the entire contents of which are incorporated herein by reference.

FIELD

Embodiments described herein relate generally to a semiconductor device, a power conversion device, a driving device, a vehicle, and an elevator.

BACKGROUND

In a power transistor that performs switching operation at high speed, a surge voltage may be generated due to a parasitic inductance, for example, at the time when the power transistor is turned off. If a surge voltage is generated, the gate insulating film is destroyed, or ringing occurs in the circuit, which is a problem. Surge voltage is difficult to detect since it has a high voltage and occurs in a short time.

DETAILED DESCRIPTION

Figure 1:
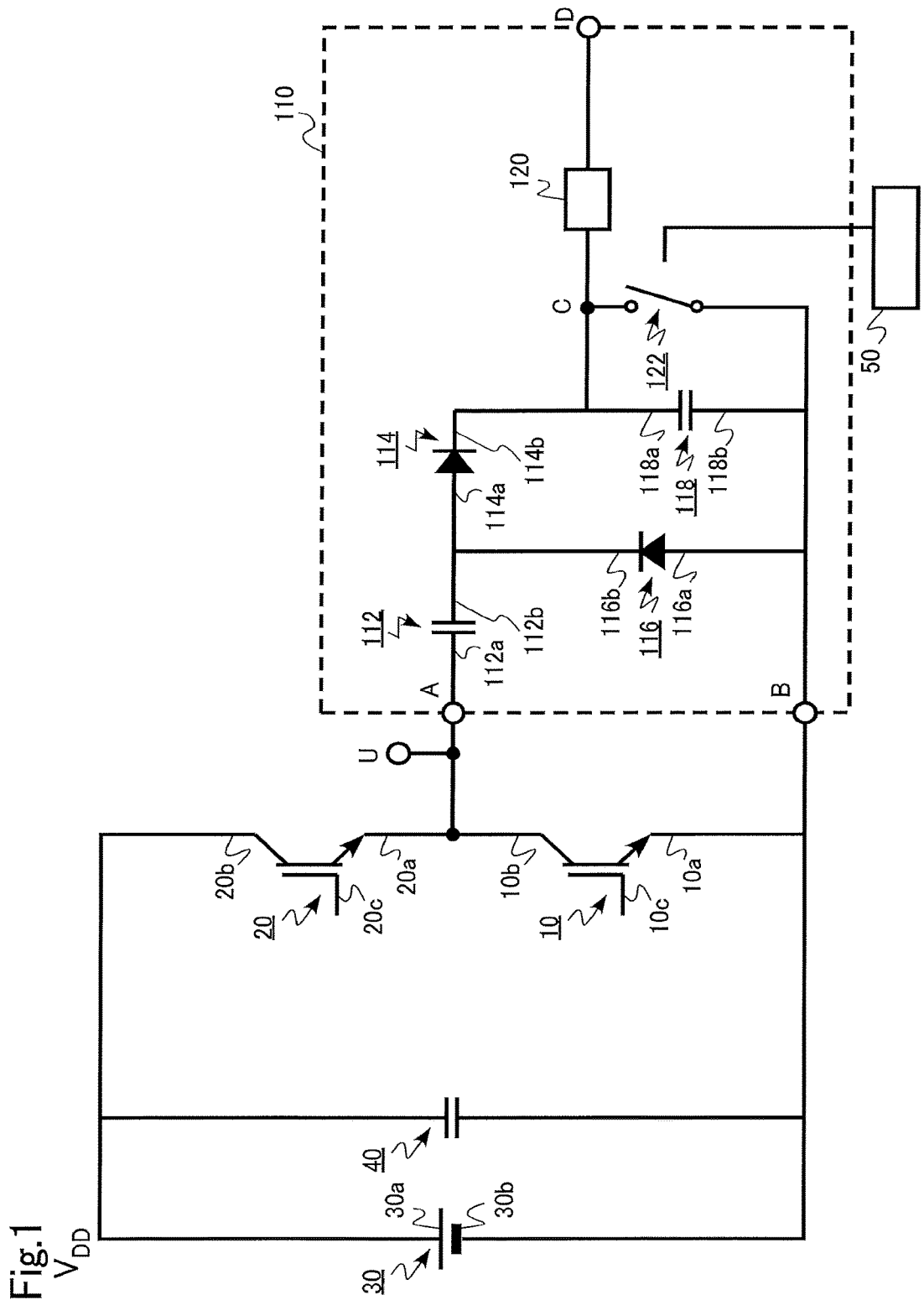
FIG. 1 is a schematic diagram of a semiconductor device according to a first embodiment.

Hereinafter, embodiments of the present disclosure will be described with reference to the drawings. In the following description, the same or similar members or the like are denoted by the same reference numerals, and the description of the members or the like once described is omitted as appropriate.

As used herein, a semiconductor device is a concept that encompasses an integrated circuit (IC) in which a plurality of elements is integrated into a single chip, an electronic circuit board on which a plurality of electronic parts is disposed, or a power module including a combination of a plurality of elements such as discrete semiconductors.

First Embodiment

A semiconductor device according to the present embodiment includes: a first capacitor having a first end and a first the other end, the first end for electrically connecting to at least one of a first electrode and a second electrode of a transistor having the first electrode, the second electrode, and a gate electrode; a first diode having a first anode and a first cathode, the first anode electrically connected to the first the other end; a second capacitor having a second end and a second the other end, the second end electrically connected to the first cathode; a sample and hold circuit electrically connected to the first cathode and the second end; a switch electrically connected in parallel with the second capacitor between the second end and the second the other end; and a second diode having a second anode and a second cathode, the second cathode electrically connected to the first the other end and the first anode.

A power conversion device according to the present embodiment includes: a transistor having a first electrode, a second electrode, and a gate electrode; a first capacitor having a first end and a first the other end, the first end electrically connected to at least one of the first electrode and the second electrode; a first diode having a first anode and a first cathode, the first anode electrically connected to the first the other end; a second capacitor having a second end and a second the other end, the second end electrically connected to the first cathode; a sample and hold circuit electrically connected to the first cathode and the second end; a switch electrically connected in parallel with the second capacitor between the second end and the second the other end; and a second diode having a second anode and a second cathode, the second cathode electrically connected to the first the other end and the first anode.

FIG. 1 is a schematic diagram of the semiconductor device according to the present embodiment. The semiconductor device according to the present embodiment is a surge voltage detection circuit 110.

Figure 2:
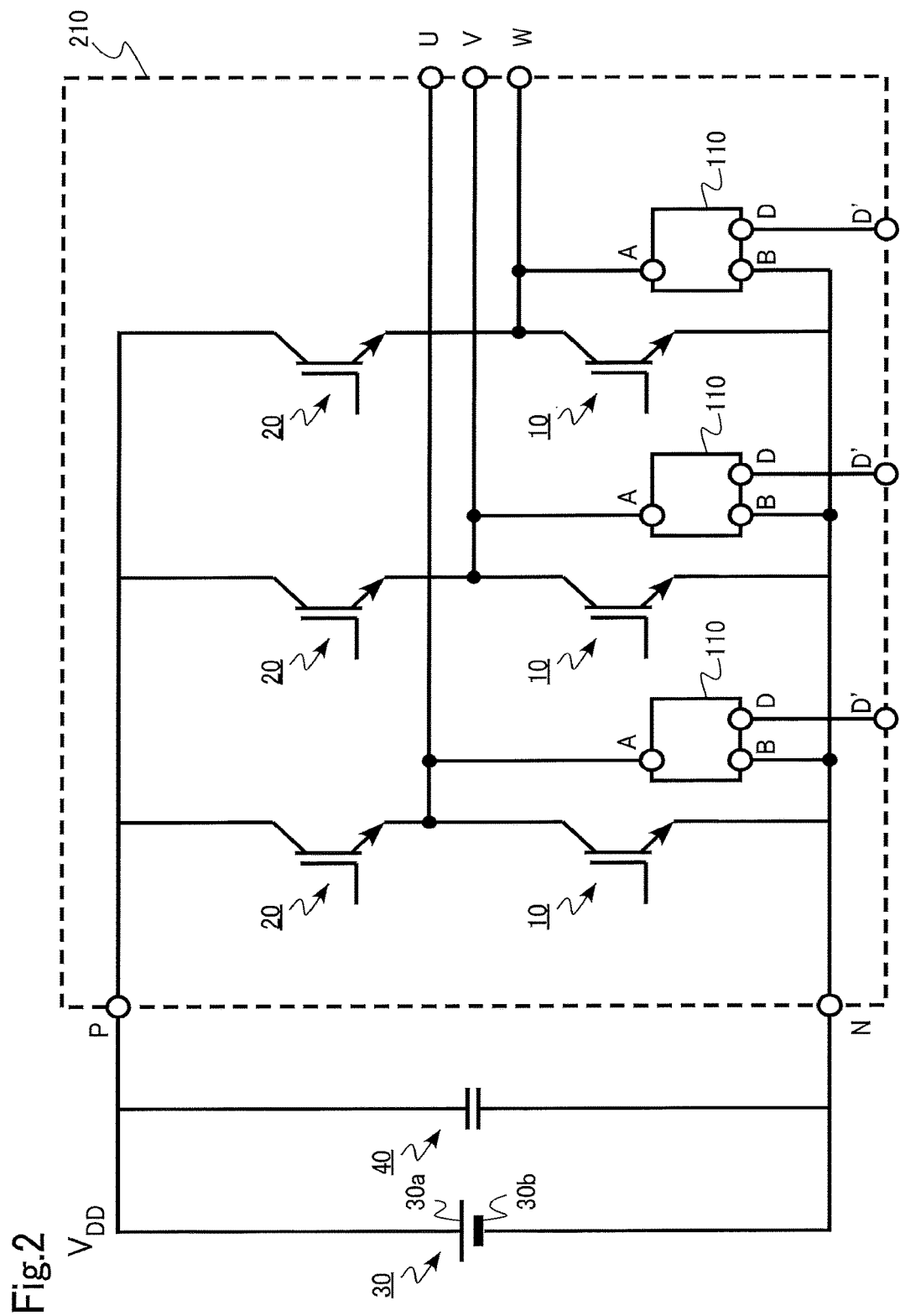
FIG. 2 is a schematic diagram of a power conversion device according to the first embodiment.

FIG. 2 is a schematic diagram of the power conversion device according to the present embodiment. The power conversion device according to the present embodiment is an inverter circuit 210 including surge voltage detection circuits 110.

FIG. 1 is a diagram illustrating a part of the inverter circuit 210. FIG. 1 is a diagram illustrating a detailed configuration of the surge voltage detection circuit 110.

The inverter circuit 210 illustrated in FIG. 2 includes three sets of low-side transistors (transistors) 10 and high-side transistors (transistors) 20, three surge voltage detection circuits 110, a positive terminal P, a negative terminal N, an output terminal U, an output terminal V, an output terminal W, and a detection terminal D'. The positive terminal P is connected to a positive electrode 30a of a DC power supply 30, and the negative terminal N is connected to a negative electrode 30b of the DC power supply 30. For example, a smoothing capacitor 40 is provided in parallel with the DC power supply 30 between the positive terminal P and the negative terminal N. The inverter circuit 210 is a three-phase inverter. The result of detecting a surge voltage provided by the surge voltage detection circuit 110 is output from the detection terminal D'.

The voltage of the DC power supply 30 is, for example, in the range of 200 to 1500 V.

The low-side transistor 10 and the high-side transistor 20 are, for example, insulated gate bipolar transistors (IGBTs). For example, freewheeling diodes (not illustrated) are connected to the low-side transistor 10 and the high-side transistor 20.

The surge voltage detection circuit 110 is, for example, an IC in which a plurality of elements is integrated into a single chip, or an electronic circuit board on which a plurality of electronic parts is disposed. The surge voltage detection circuit 110 detects a surge voltage generated between the low-side transistor 10 and the high-side transistor 20.

In FIG. 1, one set of low-side and high-side transistors 10 and 20 connected to the output terminal U is selected for illustration from among the three sets of low-side and high-side transistors 10, 20 of the inverter circuit 210. The surge voltage detection circuit 110 connected to the one set of low-side and high-side transistors 10, 20 is also illustrated.

The surge voltage detection circuit 110 includes a first capacitor 112, a first diode 114, a second diode 116, a second capacitor 118, a sample and hold circuit 120, a switch 122, a controller 50, an input terminal A, an input terminal B, and a detection terminal D.

The low-side transistor 10 of the inverter circuit 210 has an emitter electrode 10a (first electrode), a collector electrode 10b (second electrode), and a gate electrode 10c. The high-side transistor 20 of the inverter circuit 210 has an emitter electrode 20a (first electrode), a collector electrode 20b (second electrode), and a gate electrode 20c.

The input terminal A of the surge voltage detection circuit 110 is electrically connected to the collector electrode 10b of the low-side transistor 10 and the emitter electrode 20a of the high-side transistor 20. The input terminal A is electrically connected to a place where a surge voltage is likely to be generated in the electronic circuit. The input terminal B of the surge voltage detection circuit 110 is electrically connected to the negative electrode 30b of the DC power supply 30.

The result of detecting a surge voltage is output from the detection terminal D of the surge voltage detection circuit 110.

The first capacitor 112 has a first end 112a and a first the other end 112b. The first end 112a is electrically connected to the input terminal A. The first end 112a is electrically connected to the collector electrode 10b of the low-side transistor 10 and the emitter electrode 20a of the high-side transistor 20 via the input terminal A. The first end 112a is electrically connected to a place where a surge voltage is likely to be generated in the electronic circuit via the input terminal A.

The first diode 114 has a first anode 114a and a first cathode 114b. The first anode 114a is electrically connected to the first the other end 112b of the first capacitor 112.

The second capacitor 118 has a second end 118a and a second the other end 118b. The second end 118a is electrically connected to the first cathode 114b of the first diode 114.

The sample and hold circuit 120 is electrically connected to the first cathode 114b of the first diode 114 and the second end 118a of the second capacitor 118. The sample and hold circuit 120 has, for example, an operational amplifier, a diode, a capacitor, and a reset switch (not illustrated). The sample and hold circuit 120 has the function of maintaining the peak value of the voltage input to the operational amplifier of the sample and hold circuit 120 for a predetermined period. As long as the sample and hold circuit 120 has the function of maintaining the peak value for a predetermined period, the configuration of the sample and hold circuit 120 is not necessarily limited to the above configuration.

The switch 122 is electrically connected in parallel with the second capacitor 118 between the second end 118a of the second capacitor 118 and the second the other end 118b of the second capacitor 118. The switch 122 electrically connects the second end 118a and the second the other end 118b and discharges the electric charge stored in the second capacitor 118. The switch 122 is, for example, but not limited to, a transistor.

The on/off operation of the switch 122 is controlled by the controller 50, for example. The controller 50 is, for example, a microcomputer. The controller 50 is provided outside the surge voltage detection circuit 110, for example.

The second diode 116 has a second anode 116a and a second cathode 116b. The second cathode 116b is electrically connected to the first the other end 112b of the first capacitor 112 and the first anode 114a of the first diode 114.

The first capacitor 112 and the second capacitor 118 are preferably film capacitors or ceramic capacitors.

The film capacitor is a capacitor in which a resin such as polyethylene terephthalate (PET), polypropylene (PP), polyphenylene sulfide (PPS), polyethylene naphthalate (PEN), or polystyrene (PS) is used for the dielectric.

The ceramic capacitor is a capacitor in which a ceramic material such as titanium oxide, aluminum oxide, barium titanate, or strontium titanate is used for the dielectric.

It is preferable that the power supply voltage $V_{DD}$ of a transistor, the capacitance $C_1$ of the first capacitor 112, and the capacitance $C_2$ of the second capacitor 118 satisfy the relationship of $15V \leq (C_1 V_{DD})/(C_1+C_2)$.

The capacitance $C_1$ of the first capacitor 112 is preferably 1/10 or less of the output capacitance of the low-side transistor 10 or the high-side transistor 20.

The capacitance $C_2$ of the second capacitor 118 is preferably 100 pF or more.

Figure 3:
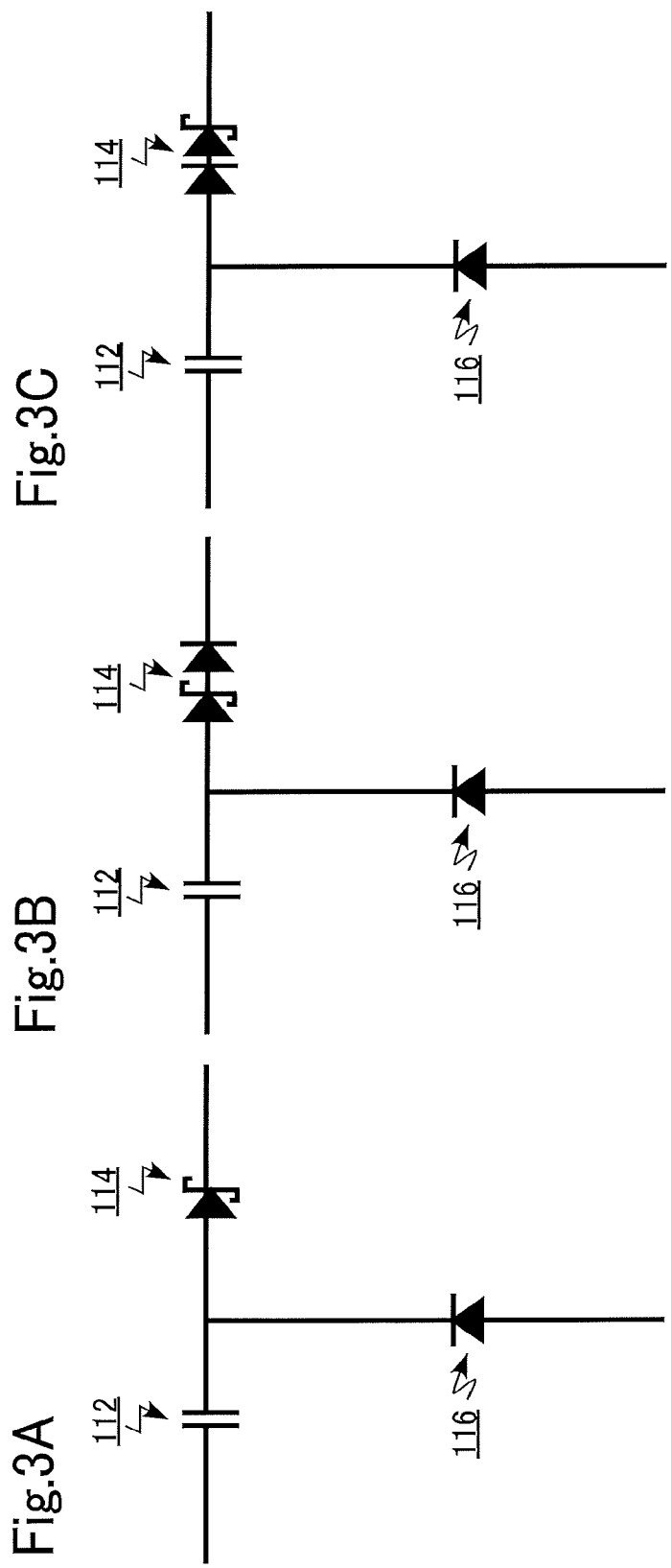
FIGS. 3A to 3C are schematic diagrams illustrating examples of a first diode according to the first embodiment.

FIGS. 3A to 3C are schematic diagrams illustrating examples of the first diode 114 according to the present embodiment.

FIG. 3A is an example of a part of the circuit of the semiconductor device according to the present embodiment using a Schottky barrier diode as the first diode 114. FIGS. 3B and 3C are examples of a part of the circuit of the semiconductor device according to the present embodiment using a combination of a Schottky barrier diode and a PN diode as the first diode 114. As illustrated in FIG. 3B, a Schottky barrier diode may be electrically connected between the first capacitor 112 and a PN diode. Alternatively, as illustrated in FIG. 3C, a PN diode may be connected between the first capacitor 112 and a Schottky barrier diode.

Figure 4:
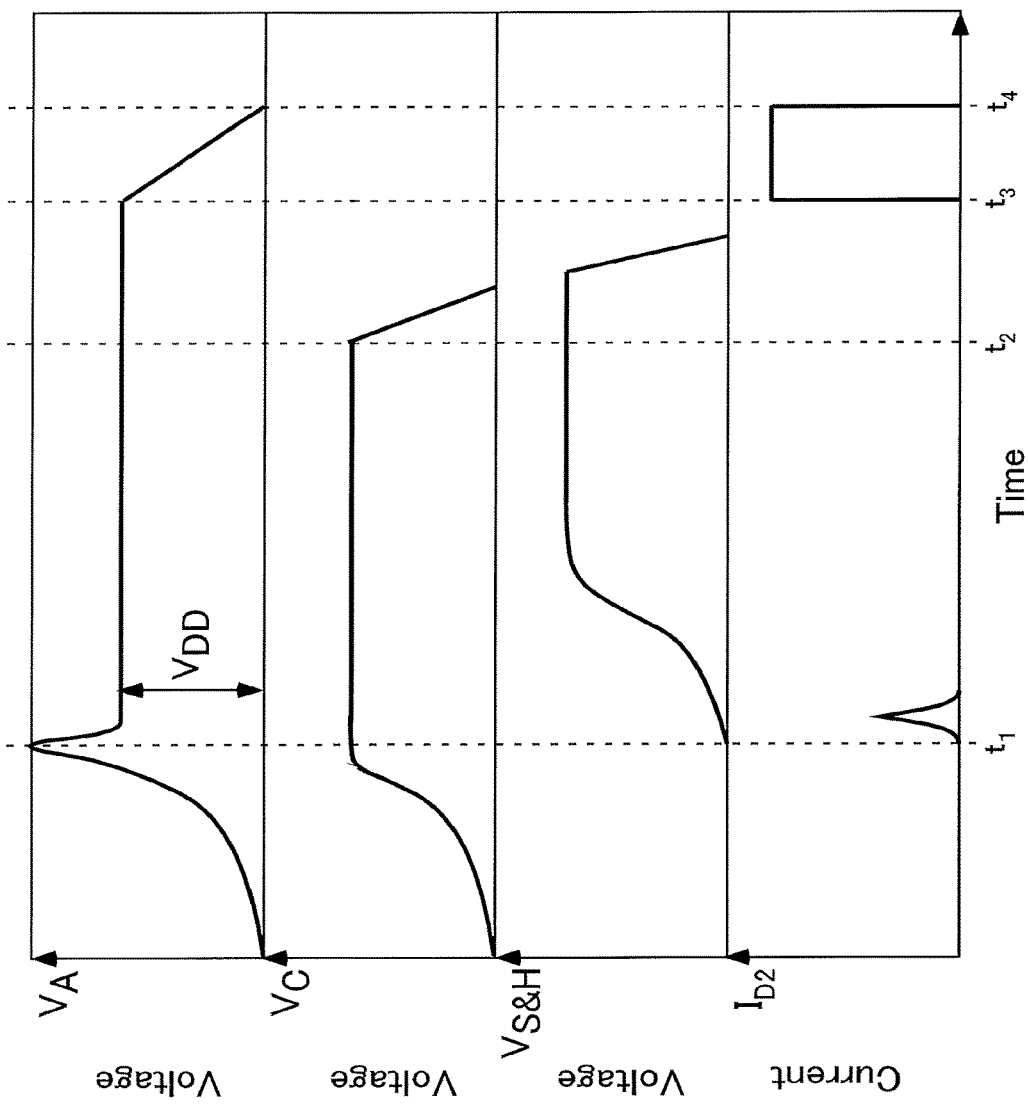
FIG. 4 is a schematic diagram illustrating temporal changes in voltage and current in the semiconductor device according to the first embodiment.

FIG. 4 is a schematic diagram illustrating temporal changes in voltage and current in the semiconductor device according to the present embodiment. In FIG. 4, temporal changes in the voltage $V_A$ of the input terminal A, the voltage $V_C$ of point C (FIG. 1) between the switch 122 and the sample and hold circuit 120, the voltage $V_{S\&H}$ detected by the sample and hold circuit 120, and the current $I_{D2}$ flowing through the second diode 116 are illustrated.

The operation of the semiconductor device according to the present embodiment will be described using FIG. 4.

A surge is generated when a transistor of the inverter circuit 210 is turned off. Here, consider a case where the low-side transistor 10 is turned off. While the low-side transistor 10 is on, the resistance of the low-side transistor 10 is zero. Therefore, $V_A$ is zero while the low-side transistor 10 is on.

Next, it is assumed that a surge is generated when the low-side transistor 10 is turned off, the surge voltage reaches a maximum at time $t_1$, and then the surge disappears.

At time $t_1$, the local maximum of voltage $V_A$ corresponding to the generation of the surge voltage is detected.

Since the input terminal A is connected to the first capacitor 112, a displacement current flows through the first capacitor 112. At this time, the first diode 114 is turned on, and electric charge is accumulated in the second capacitor 118. Therefore, $V_C$ increases.

Generally, the forward voltage of the first diode 114 is sufficiently smaller than the surge voltage and the voltage output from the inverter circuit 210. Therefore, ignoring the forward voltage of the first diode 114, the voltage obtained by dividing the power supply voltage $V_{DD}$ of the transistor by the first capacitor 112 and the second capacitor 118 is detected as $V_C$.

The surge disappears after time $t_1$. Therefore, $V_A$ decreases after time $t_1$ has elapsed. Since the high-side transistor 20 has been turned on and the low-side transistor 10 has been turned off by this time, the power supply voltage $V_{DD}$ of the transistor is detected as $V_A$.

Despite the reduction in voltage $V_A$ to $V_{DD}$, the electric charge accumulated in the second capacitor 118 does not flow to the first capacitor 112 owing to the presence of the first diode 114. On the other hand, the electric charge accumulated in the first capacitor 112 flows toward the input terminal A. Owing to the presence of the second diode 116, the current flowing toward the input terminal A flows from the second diode 116 through the first capacitor 112. Therefore, when the surge disappears after time $t_1$, a current flows through the second diode 116.

Since the operational amplifier of the sample and hold circuit 120 has a time constant longer than the time of change in the surge, voltage $V_{S\&H}$ increases after time $t_1$ and becomes constant after that.

At time $t_2$, the switch 122 is used to discharge the electric charge accumulated in the second capacitor 118. As a result, $V_C$ reaches zero.

After time $t_2$, the sample and hold circuit 120 is reset by using the reset switch of the sample and hold circuit 120. As a result, $V_{S\&H}$ reaches zero.

It is assumed that the low-side transistor 10 is turned on and the high-side transistor 20 is turned off at time $t_3$. At this time, $V_A$ decreases with time and reaches zero at time $t_4$. No current flows from the second capacitor 118 to the first capacitor 112 owing to the presence of the first diode 114, but a current flows from the second diode 116 to the first capacitor 112.

Figure 5:
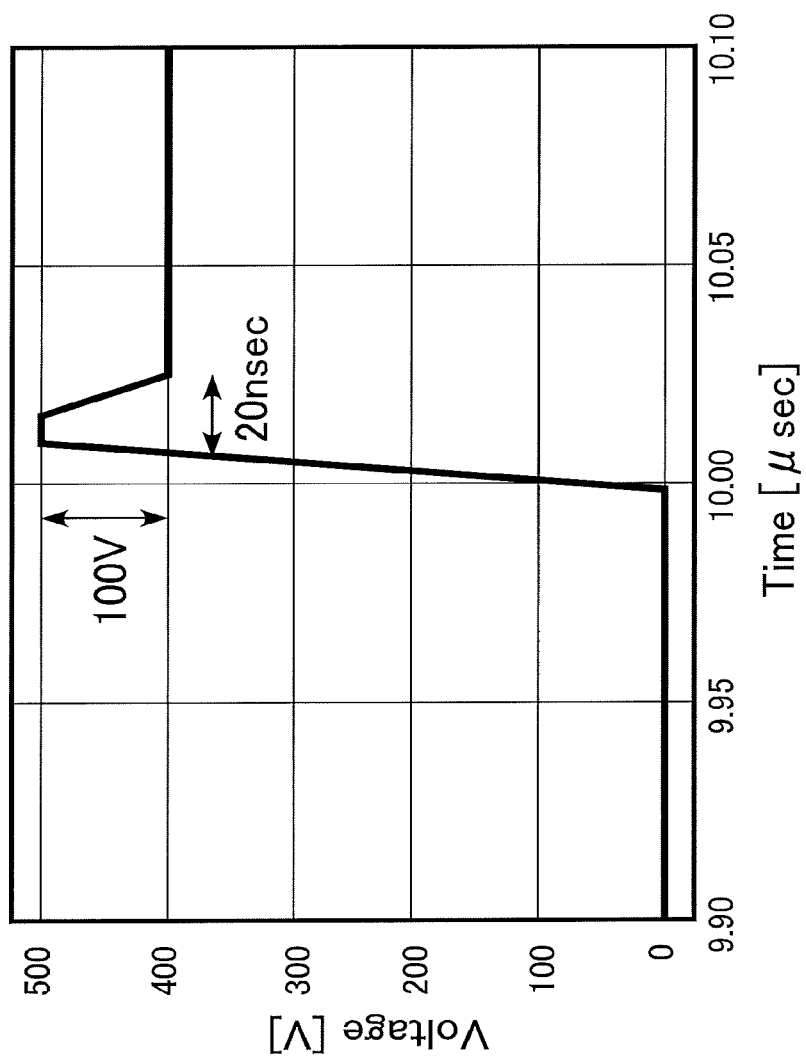
FIG. 5 is a schematic diagram illustrating an example of the waveform of a surge voltage.

FIG. 5 is a schematic diagram illustrating an example of the waveform of a surge voltage. At time 10 μS, a surge voltage of about 20 nsec in width and 100 V in magnitude is generated. The main voltage is 400 V.

Figure 6:
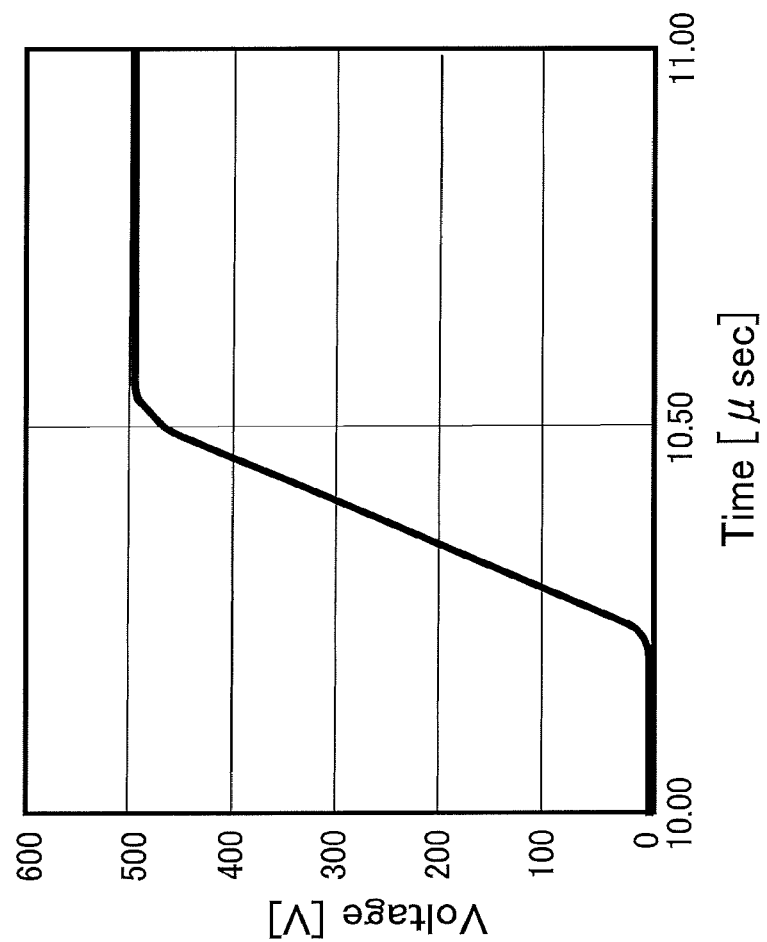
FIG. 6 is a schematic diagram illustrating a surge voltage detection characteristic of the semiconductor device according to the first embodiment.

FIG. 6 is a schematic diagram illustrating a surge voltage detection characteristic of the semiconductor device according to the present embodiment. In FIG. 6, the surge voltage illustrated in FIG. 5 is detected by the semiconductor device according to the present embodiment. A voltage of 500 V which is the sum of the main voltage 400 V and the surge voltage 100 V is detected.

Next, operations and effects of the semiconductor device and the power conversion device according to the present embodiment will be described.

As described in the present embodiment, it is possible to detect a surge voltage by providing: a first capacitor having a first end and a first the other end, the first end being electrically connected to at least one of a first electrode and a second electrode of a transistor having the first electrode, the second electrode, and a gate electrode; a first diode having a first anode and a first cathode, the first anode being electrically connected to the first the other end; a second capacitor having a second end and a second the other end, the second end being electrically connected to the first cathode; a sample and hold circuit electrically connected to the first cathode and the second end; a switch electrically connected in parallel with the second capacitor between the second end and the second the other end; and a second diode having a second anode and a second cathode, the second cathode being electrically connected to the first the other end and the first anode.

In a power transistor that performs switching operation at high speed, a surge voltage may be generated due to a parasitic inductance, for example, at the time when the power transistor is turned off. If a surge voltage is generated, the gate insulating film is destroyed, or ringing occurs in the circuit, which is a problem.

The peak value of the surge voltage generated in the power transistor has a high voltage of several hundred volts and a short pulse width of several tens of nanoseconds. For this reason, for example, it is difficult to detect the peak value of the surge voltage only with the existing sample and hold circuit 120.

In the semiconductor device and the power conversion device according to the present embodiment, a displacement current is caused to flow by the first capacitor 112, and electric charge is accumulated in the second capacitor 118. Then, the voltage increased by the accumulation of the electric charge is detected by the sample and hold circuit 120. As a result, the surge voltage can be detected by the existing sample and hold circuit 120. Note that the discharge of the electric charge accumulated in the second capacitor 118 is avoided by the first diode 114.

When the surge disappears, a current flows from the first capacitor 112 toward the input terminal A. This current flow is guaranteed by the second diode 116.

Surges may occur every time a transistor of the power conversion device is turned off. Therefore, it is preferable that the surge voltage detection circuit 110 can measure surges frequently. Since the switch 122 is provided in the semiconductor device and the power conversion device according to the present embodiment, the electric charge accumulated in the second capacitor 118 can be discharged point by point.

Schottky barrier diodes have less recovery time than PN diodes. Therefore, it is preferable that the first diode 114 have a Schottky barrier diode.

On the other hand, PN diodes have less leakage current than Schottky barrier diodes. Therefore, it is preferable that the first diode 114 have both a Schottky barrier diode and a PN diode to reduce both recovery time and leakage current.

Since film capacitors and ceramic capacitors have good frequency characteristics, it is possible to detect a surge voltage having a narrow full width at half maximum by using them as the first capacitor 112 and the second capacitor 118.

The most typical withstand voltage of the operational amplifier used for the sample and hold circuit 120 is 15 V. Therefore, if the voltage $(C_1 V_{DD})/(C_1+C_2)$ applied to the second capacitor 118 is 15 V or less, the existing sample and hold circuit 120 is easily utilized.

It is preferable that the capacitance $C_1$ of the first capacitor 112 be small enough not to affect the operation of the low-side transistor 10 or the high-side transistor 20. If the capacitance $C_1$ of the first capacitor 112 is too large, a large capacitance is connected to the low-side transistor 10 or the high-side transistor 20, so that the operation of the power conversion device is affected, and as a result, the measurement of surges generated by the power conversion device is also affected. If the capacitance $C_1$ of the first capacitor 112 is 1/10 or less of the output capacitance of the low-side transistor 10 or the high-side transistor 20, it is possible to measure surges without affecting the operation of the power conversion device.

If the capacitance $C_2$ of the second capacitor 118 is less than 100 pF, leakage increases, making it difficult to stably accumulate electric charge. Therefore, the capacitance $C_2$ of the second capacitor 118 is preferably 100 pF or more.

The semiconductor device and the power conversion device according to the present embodiment can thus detect a surge voltage.

Second Embodiment

A power conversion device according to the present embodiment further includes a variable resistor electrically connected to the gate electrode and a controller that controls the resistance value of the variable resistor based on the voltage value output from the sample and hold circuit, which is different from the power conversion device according to the first embodiment. Hereinafter, the description of contents overlapping with those of the first embodiment will be omitted.

Figure 7:
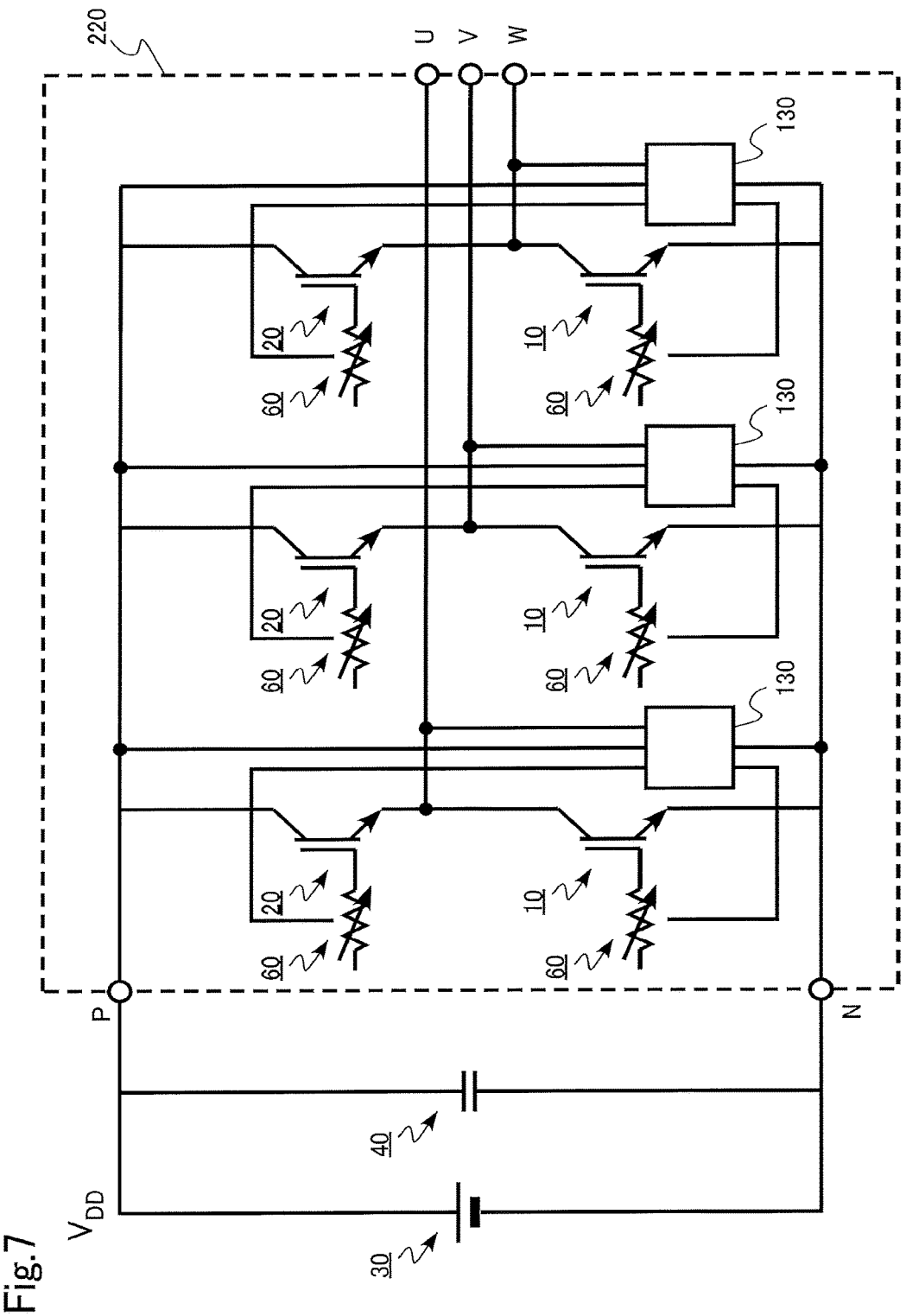
FIG. 7 is a schematic diagram of a power conversion device according to a second embodiment.

FIG. 7 is a schematic diagram of the power conversion device according to the present embodiment. The power conversion device according to the present embodiment is an inverter circuit 220 including surge voltage detection circuits 130.

Figure 8:
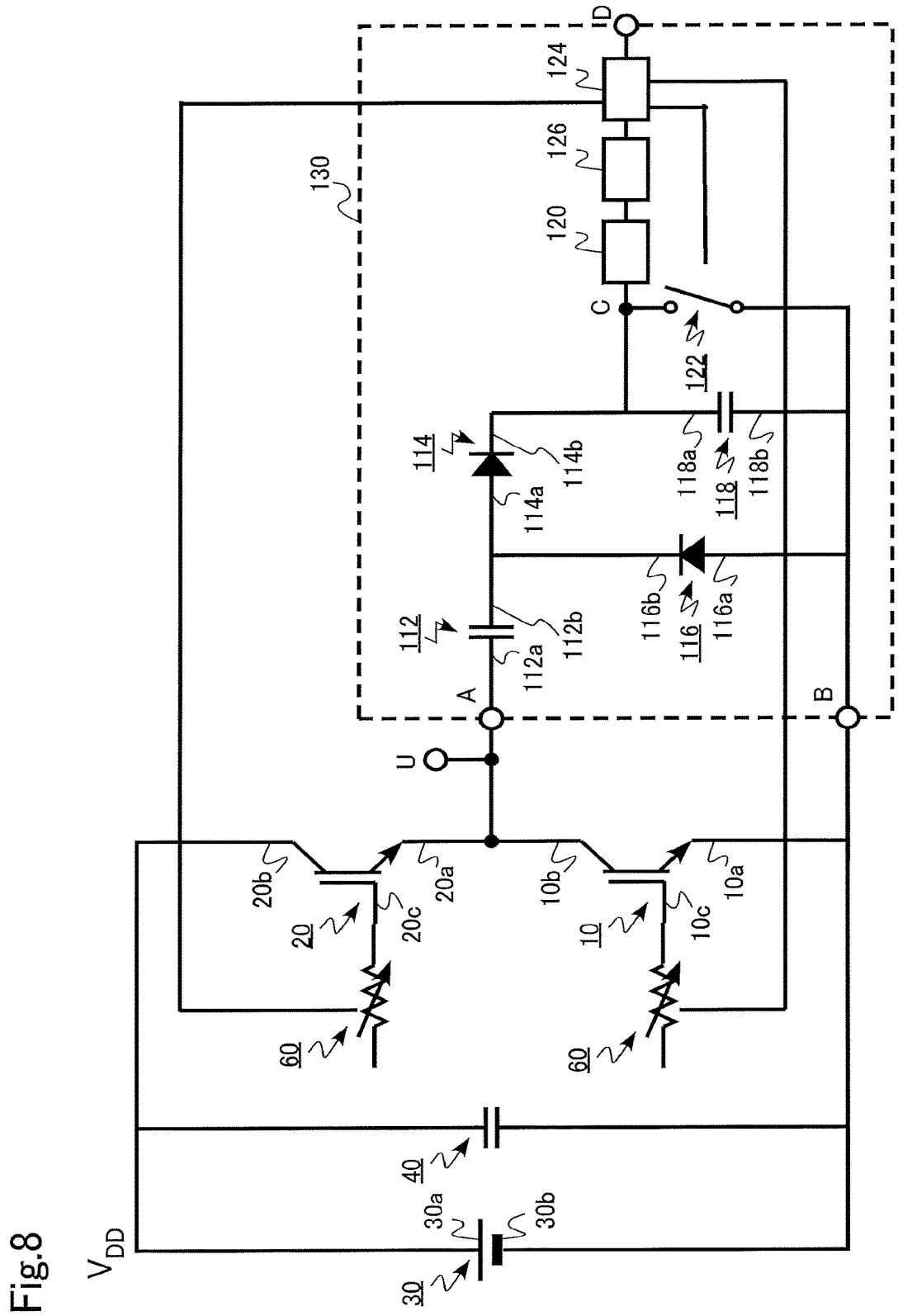
FIG. 8 is a schematic diagram of a semiconductor device according to the second embodiment.

FIG. 8 is a schematic diagram of a semiconductor device according to the present embodiment. The semiconductor device according to the present embodiment is the surge voltage detection circuit 130.

The inverter circuit 220 according to the present embodiment realizes what is called active gate control to dynamically control the gate voltage of a power transistor.

The inverter circuit 220 includes a variable resistor 60. The variable resistor 60 is electrically connected to each of the gate electrodes 10c of the low-side transistors (transistors) 10 and the gate electrodes 20c of the high-side transistors (transistors) 20.

The surge voltage detection circuit 130 includes the sample and hold circuit 120, an analog-digital converter 126, and a microcomputer (controller) 124.

The voltage value of the input terminal A is input to the microcomputer 124 via the sample and hold circuit 120 and the analog-digital converter 126.

The analog-digital converter 126 is connected to the sample and hold circuit 120. The analog-digital converter 126 digitally converts the voltage detected by the sample and hold circuit 120 and outputs the converted voltage. The presence of the analog-digital converter 126 connected to the sample and hold circuit 120 enables digital output of a surge voltage.

The voltage value of the input terminal A is based on the peak value of the surge voltage. The microcomputer 124 issues a command to change the resistance value of the variable resistor 60 based on the peak value of the surge voltage derived from the voltage value of the input terminal A. As a result, the gate charging/discharging currents of the low-side transistor 10 and the high-side transistor 20 are changed, and the inverter circuit 220 is controlled so that the surge voltage has a predetermined voltage value or less.

The configuration of the variable resistor 60 is not limited as long as it has a variable resistance. For example, the variable resistor 60 is a MOSFET that operates in an analog manner. According to a command from the microcomputer 124, for example, the gate voltage of the MOSFET changes and the resistance changes. Alternatively, for example, the variable resistor 60 is a plurality of MOSFETs connected in parallel. By changing the number of MOSFETs in the on and off states, the resistance changes.

The on/off operation of the switch 122 is also controlled by a command from the microcomputer 124.

As described above, according to the present embodiment, by controlling the gate voltage of a power transistor dynamically using the surge voltage detection circuit, an inverter circuit that suppresses surge voltage can be realized.

Third Embodiment

A driving device according to the present embodiment is a driving device including the power conversion device according to the first embodiment.

Figure 9:
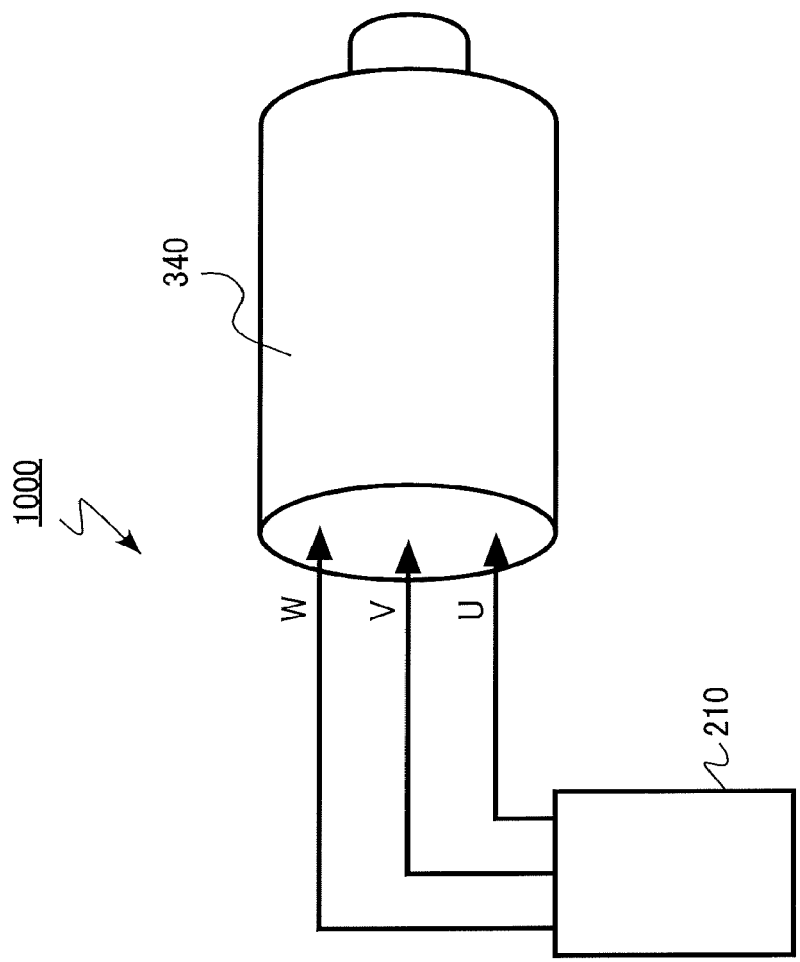
FIG. 9 is a schematic diagram of a driving device according to a third embodiment.

FIG. 9 is a schematic diagram of the driving device according to the present embodiment. The driving device 1000 includes a motor 340 and the inverter circuit 210. The AC voltage output from the inverter circuit 210 drives the motor 340.

According to the present embodiment, the characteristics of the driving device 1000 are improved by providing the inverter circuit 210 capable of detecting a surge voltage.

Fourth Embodiment

A vehicle according to the present embodiment is a vehicle including the power conversion device according to the first embodiment.

Figure 10:
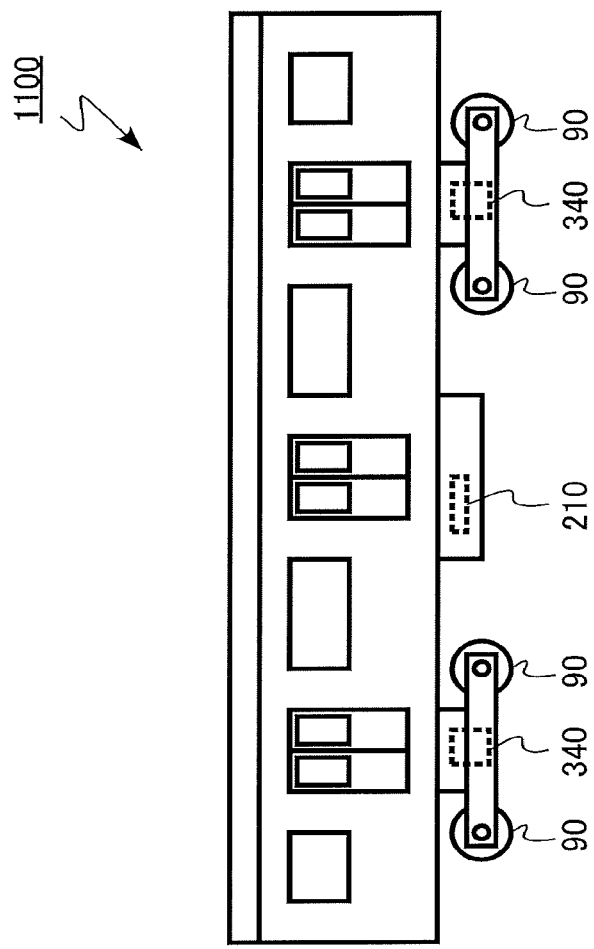
FIG. 10 is a schematic diagram of a vehicle according to a fourth embodiment.

FIG. 10 is a schematic diagram of the vehicle according to the present embodiment. The vehicle 1100 according to the present embodiment is a railroad vehicle. The vehicle 1100 includes motors 340 and the inverter circuit 210.

The AC voltage output from the inverter circuit 210 drives the motors 340. Wheels 90 of the vehicle 1100 are rotated by the motors 340.

According to the present embodiment, the characteristics of the vehicle 1100 are improved by providing the inverter circuit 210 capable of detecting a surge voltage.

Fifth Embodiment

A vehicle according to the present embodiment is a vehicle including the power conversion device according to the first embodiment.

Figure 11:
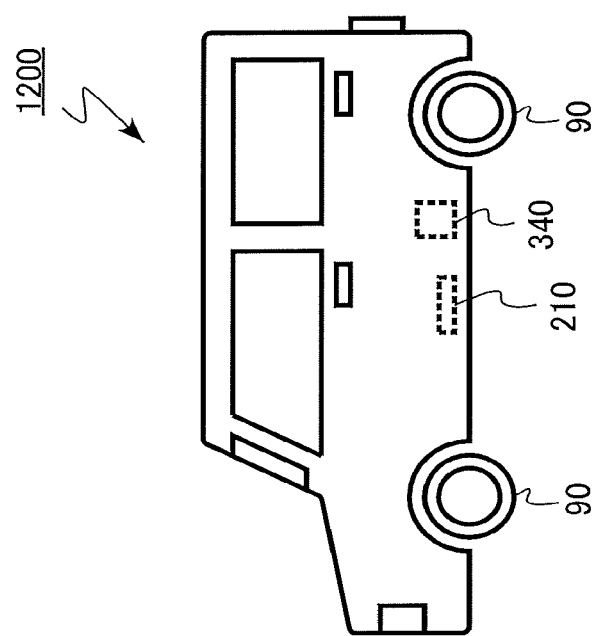
FIG. 11 is a schematic diagram of a vehicle according to a fifth embodiment.

FIG. 11 is a schematic diagram of the vehicle according to the present embodiment. The vehicle 1200 according to the present embodiment is an automobile. The vehicle 1200 includes the motor 340 and the inverter circuit 210.

The AC voltage output from the inverter circuit 210 drives the motor 340. Wheels 90 of the vehicle 1200 are rotated by the motor 340.

According to the present embodiment, the characteristics of the vehicle 1200 are improved by providing the inverter circuit 210 capable of detecting a surge voltage.

Sixth Embodiment

An elevator according to the present embodiment is an elevator including the power conversion device according to the first embodiment.

Figure 12:
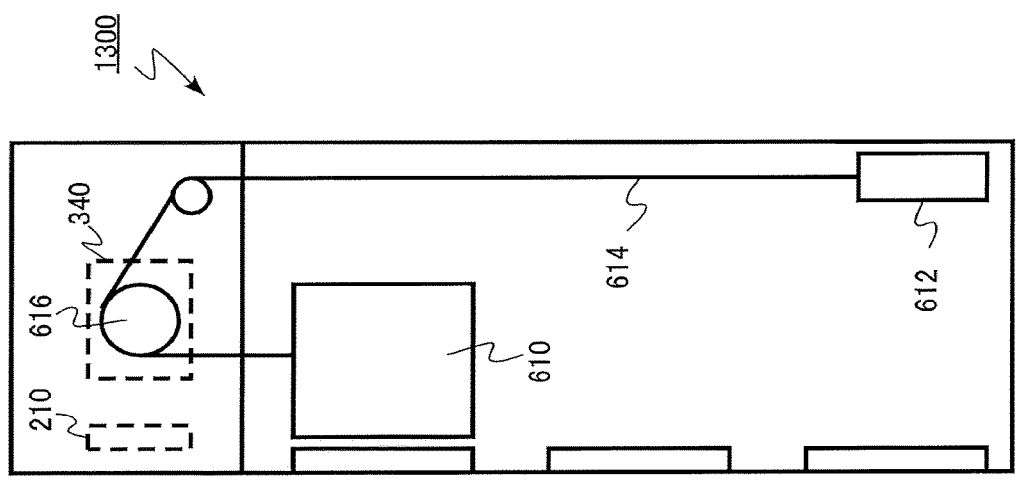
FIG. 12 is a schematic diagram of an elevator according to a sixth embodiment.

FIG. 12 is a schematic diagram of the elevator according to the present embodiment. The elevator 1300 according to the present embodiment includes a car 610, a counterweight 612, a wire rope 614, a hoisting machine 616, the motor 340, and the inverter circuit 210.

The AC voltage output from the inverter circuit 210 drives the motor 340. The hoisting machine 616 is rotated by the motor 340, and the car 610 moves up and down.

According to the present embodiment, the characteristics of the elevator 1300 are improved by providing the inverter circuit 210 capable of detecting a surge voltage.

In the first or second embodiment, the inverter circuit is described as an example of the power conversion device, but a DC-DC converter can also be applied as the power conversion device. In the described examples, the surge voltage generated in a transistor of the power conversion device is detected by the surge voltage detection circuit, but the surge voltage detection circuits according to the embodiments and modifications can also be applied to detecting the surge voltage generated in transistors used for any application other than the power conversion device.

Further, in the examples described in the third to sixth embodiments, the semiconductor devices and the power conversion devices according to the present disclosure are applied to the driving device, the vehicles, or the elevator, but the semiconductor devices and the power conversion devices according to the present disclosure can also be applied, for example, to power conditioners of photovoltaic power generation systems or the like.

While certain embodiments have been described, these embodiments have been presented by way of example only, and are not intended to limit the scope of the inventions. Indeed, the semiconductor devices, the power conversion devices, the driving device, the vehicles, and the elevator described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
a first capacitor having a first end and a first another end, the first end for electrically connecting to at least one of a first electrode and a second electrode of a transistor having the first electrode, the second electrode, and a gate electrode;
a first diode having a first anode and a first cathode, the first anode electrically connected to the first another end;
a second capacitor having a second end and a second another end, the second end electrically connected to the first cathode;
a sample and hold circuit electrically connected to the first cathode and the second end;
a switch electrically connected in parallel with the second capacitor between the second end and the second another end; and
a second diode having a second anode and a second cathode, the second cathode electrically connected to the first another end and the first anode,
wherein a power supply voltage $V_{DD}$ of the transistor, a capacitance $C_1$ of the first capacitor, and a capacitance $C_2$ of the second capacitor satisfy $15V \leq (C_1 V_{DD})/(C_1 + C_2)$.

2. The device according to claim 1, wherein the first diode has a Schottky barrier diode.

3. The device according to claim 1, wherein the first capacitor and the second capacitor are film capacitors or ceramic capacitors.

4. The device according to claim 1, wherein the capacitance $C_1$ of the first capacitor is 1/10 or less of an output capacitance of the transistor.

5. The device according to claim 1, wherein the capacitance $C_2$ of the second capacitor is 100 pF or more.

6. The device according to claim 2, wherein the first diode further has a PN diode.

7. The device according to claim 6, wherein the Schottky barrier diode has a third anode and a third cathode, the PN diode has a fourth anode and a fourth cathode, the third anode is electrically connected to the first another end, the third cathode is electrically connected to the fourth anode, and the fourth cathode is electrically connected to the second end.

8. The device according to claim 6, wherein the Schottky barrier diode has a third anode and a third cathode, the PN diode has a fourth anode and a fourth cathode, the fourth anode is electrically connected to the first another end, the fourth cathode is electrically connected to the third anode, and the third cathode is electrically connected to the second end.

9. A power conversion device comprising:
a transistor having a first electrode, a second electrode, and a gate electrode;
a first capacitor having a first end and a first another end, the first end electrically connected to at least one of the first electrode and the second electrode;
a first diode having a first anode and a first cathode, the first anode electrically connected to the first another end;
a second capacitor having a second end and a second another end, the second end electrically connected to the first cathode;
a sample and hold circuit electrically connected to the first cathode and the second end;
a switch electrically connected in parallel with the second capacitor between the second end and the second another end;
a second diode having a second anode and a second cathode, the second cathode electrically connected to the first another end and the first anode;
a variable resistor electrically connected to the gate electrode; and
a controller configured to control a resistance value of the variable resistor based on a voltage value output from the sample and hold circuit.

10. The device according to claim 9, wherein the first diode has a Schottky barrier diode.

11. The device according to claim 9, wherein the first capacitor and the second capacitor are film capacitors or ceramic capacitors.

12. The device according to claim 9, wherein a power supply voltage $V_{DD}$ of the transistor, a capacitance $C_1$ of the first capacitor, and a capacitance $C_2$ of the second capacitor satisfy $15V \leq (C_1 V_{DD})/(C_1 + C_2) \times V_{dd}$.

13. The device according to claim 9, wherein
a capacitance $C_1$ of the first capacitor is 1/10 or less of an output capacitance of the transistor.

14. The device according to claim 9, wherein
a capacitance $C_2$ of the second capacitor is 100 pF or more.

15. The device according to claim 9, further comprising:
an analog-digital converter connected to the sample and hold circuit.

16. A driving device comprising:
the power conversion device according to claim 9.

17. A vehicle comprising:
the power conversion device according to claim 9.

18. An elevator comprising:
the power conversion device according to claim 9.

19. The device according to claim 10, wherein
the first diode further has a PN diode.

20. The device according to claim 19,
wherein the Schottky barrier diode has a third anode and a third cathode, the PN diode has a fourth anode and a fourth cathode, the third anode is electrically connected to the first another end, the third cathode is electrically connected to the fourth anode, and the fourth cathode is electrically connected to the second end.

21. The device according to claim 19,
wherein the Schottky barrier diode has a third anode and a third cathode, the PN diode has a fourth anode and a fourth cathode, the fourth anode is electrically connected to the first another end, the fourth cathode is electrically connected to the third anode, and the third cathode is electrically connected to the second end.

22. A power conversion device comprising:
a transistor having a first electrode, a second electrode, and a gate electrode;
a first capacitor having a first end and a first another end, the first end electrically connected to at least one of the first electrode and the second electrode;
a first diode having a first anode and a first cathode, the first anode electrically connected to the first another end;
a second capacitor having a second end and a second another end, the second end electrically connected to the first cathode;
a sample and hold circuit electrically connected to the first cathode and the second end;
a switch electrically connected in parallel with the second capacitor between the second end and the second another end;
a second diode having a second anode and a second cathode, the second cathode electrically connected to the first another end and the first anode,
wherein a power supply voltage $V_{DD}$ of the transistor, a capacitance $C_1$ of the first capacitor, and a capacitance $C_2$ of the second capacitor satisfy $15V \leq (C_1 V_{DD})/(C_1 + C_2) \times V_{dd}$.

23. The device according to claim 22, further comprising:
a variable resistor electrically connected to the gate electrode; and
a controller configured to control a resistance value of the variable resistor based on a voltage value output from the sample and hold circuit.

24. The device according to claim 22, wherein
the first diode has a Schottky barrier diode.

25. The device according to claim 22, wherein
the first capacitor and the second capacitor are film capacitors or ceramic capacitors.

26. The device according to claim 22, wherein
the capacitance $C_1$ of the first capacitor is 1/10 or less of an output capacitance of the transistor.

27. The device according to claim 22, wherein
the capacitance $C_2$ of the second capacitor is 100 pF or more.

28. The device according to claim 22, further comprising:
an analog-digital converter connected to the sample and hold circuit.

29. A driving device comprising:
the power conversion device according to claim 22.

30. A vehicle comprising:
the power conversion device according to claim 22.

31. An elevator comprising:
the power conversion device according to claim 22.

32. The device according to claim 24, wherein
the first diode further has a PN diode.

33. The device according to claim 32,
wherein the Schottky barrier diode has a third anode and a third cathode, the PN diode has a fourth anode and a fourth cathode, the third anode is electrically connected to the first another end, the third cathode is electrically connected to the fourth anode, and the fourth cathode is electrically connected to the second end.

34. The device according to claim 32,
wherein the Schottky barrier diode has a third anode and a third cathode, the PN diode has a fourth anode and a fourth cathode, the fourth anode is electrically connected to the first another end, the fourth cathode is electrically connected to the third anode, and the third cathode is electrically connected to the second end.

* * * * *